United States Patent [19]

Srivastava

[11] Patent Number: 5,126,639
[45] Date of Patent: Jun. 30, 1992

[54] SEQUENTIAL SCAN SYSTEM CHANGES FOR MULTIPLE FREQUENCY RANGE OSCILLATOR AND CONTROL

[75] Inventor: Gopal K. Srivastava, Arlington Heights, Ill.

[73] Assignee: Zenith Electronics Corporation, Glenview, Ill.

[21] Appl. No.: 724,622

[22] Filed: Jul. 2, 1991

Related U.S. Application Data

[63] Continuation-in-part of Ser. No. 709,939, Jun. 4, 1991.

[51] Int. Cl.$^5$ .................. G09G 1/04; H01J 29/70; H03L 7/00
[52] U.S. Cl. .................................... 315/364; 358/158
[58] Field of Search ................. 315/364; 358/158, 150

[56] References Cited

U.S. PATENT DOCUMENTS 4,922,343  5/1990  Ando ................................ 315/358
5,021,719  6/1991  Arai et al. ........................ 315/364

*Primary Examiner*—Gregory C. Issing

[57] ABSTRACT

An adaptive oscillator control system includes a phase locked loop together with a static phase error correction system and external scan system components. An oscillator range control includes a processor having a plurality of established oscillator frequency ranges which are identified by oscillator range code numbers. A first frequency approximation is provided based upon either an oscillator range code number or a known standard scan frequency. A frequency detector provides a second frequency approximation and a confidence circuit examines oscillator consistency and enables the phase locked loop. Thereafter, a lock detector responds to the occurence of frequency and phase lock by the phase lock loop to enable the static phase error corrector and deactivate the oscillator range control system. The lock detector upon detecting horizontal synchronization, for broadcast type video, increases the second frequency approximation range. The system changes oscillator frequency and tuning and adjusts external sweep components such as phase locked loop filter, horizontal yoke tuning, and drive signal applied to the horizontal output amplifier after lock.

13 Claims, 5 Drawing Sheets

| ORC RANGE WINDOW | | | |
|---|---|---|---|
| ADDRESS | ORC | START | END |
| 0 | 0 | 840 | 968 |
| 1 | 1 | 736 | 864 |
| 2 | 2 | 640 | 752 |
| 3 | 3 | 552 | 656 |
| 4 | 4 | 480 | 568 |
| 5 | 5 | 416 | 496 |
| 6 | 6 | 368 | 432 |
| 7 | 7 | 320 | 376 |
| 8 | 8 | 272 | 328 |
| 9 | 9 | 240 | 280 |
| 10 | 10 | 208 | 248 |
| 11 | 11 | 176 | 216 |
| 12 | 12 | 152 | 184 |
| 13 | 13 | 136 | 160 |
| 14 | 14 | 120 | 140 |
| 15 | 15 | 104 | 124 |

*Fig. 3*

SEQUENTIAL SCAN SYSTEM CHANGES FOR MULTIPLE FREQUENCY RANGE OSCILLATOR AND CONTROL

CROSS REFERENCE TO RELATED PATENT APPLICATION

This application is a continuation-in-part of a copending application Ser. No. 07/709939, filed Jun. 4, 1991 and entitled MULTIPLE FREQUENCY RANGE OSCILLATOR AND CONTROL, which is assigned to the assignee of the present application and which is hereby incorporated herein by reference.

FIELD OF THE INVENTION

This invention relates generally to video displays and particularly to the synchronization and control of display scan systems therein.

BACKGROUND OF THE INVENTION

Several different types of television broadcast formats and standards are used in different locals throughout the world. Two of the most pervasive are the system used in the United States of America known as NTSC (National Television Standards Committee) and the European system known as Pal (Phase Alternating Line). In addition, several systems for providing increased picture resolution or definition, generally referred to as HDTV (High Definition Television) have been and are continuing to be developed.

While the television receivers operating in these varied systems are equally varied, certain aspects remain generally similar. For example, most television receivers include circuitry for selecting the desired television signal from among a plurality of broadcast signals available, a signal processing system which recovers the picture and sound information from the broadcast signal, systems for sequentially scanning a display device such as a cathode ray tube in both horizontal and vertical directions, and scan synchronization systems operative upon the display to coordinate display scanning to the picture and sound information.

Despite significant differences between the signal selection and signal processing functions of television receivers operating in accordance with the above-mentioned variety of broadcast systems, the functions of display scanning and synchronzation are generally quite similar. Generally, picture and sound inforamtion together with scan synchronizing signals are modulated upon a broadcast carrier at the transmitter. At the receiver, the scan synchronizing signals are separated from the remainder of the picture and sound information and used to control locally generated horizontal and vertical scan signals. The latter are used to drive the scanning circuits of the display system.

Computer monitors and many video game devices are also similar to television receivers in that they include a display system, such as a cathode ray tube, which is scanned in synchronism with picture information. In such system, the scan signals are computer generated and are used to synchronize display scan and picture information in much the same manner as television receivers.

Because the horizontal scan oscillator control used in the variety of television receivers, computer monitors and video game displays are substantially identical in overall function, it seems logical to provide a single system which may be operated for all such uses (e.g. a "universal" system). However, attempts to do so have been frustrated largely by the broad range of scan frequencies over which such a universal scan control system would be required to operate.

As is well known, the operation of display system synchronization controlling the horizontal scan oscillator is extremely demanding. Meeting these demands is made challenging by the need for precise control of both the frequency and phase of the horizontal scan oscillator. Maintaining frequency control over a broad range of reference scan frequencies generally leads to systems which lack stable precise phase control. Conversely, highly precise stable phase locking systems usually lack the ability to accommodate a wide range of frequencies.

For example, one of the most common and pervasive horizontal scan oscillator control systems used in television receivers, computer monitors, or video games is generally referred to as a phase locked loop. While a variety of different phase locked loop systems have been developed, in most, an oscillator produces an output signal having a frequency dependent upon an applied control signal. A phase detector compares the oscillator output signal to the reference signals and produces an error signal indicative of the frequency and phase relationship therebetween. This error signal is amplified to produce a control signal applied to the oscillator in a closed loop arrangement.

As is well known, conventional phase locked loop systems respond to large frequency differences by reaching an equilibrium point in which a sufficient error voltage is maintained by the phase detector to provided the necessary control of the oscillator. This equilibrium results in a condition in which the frequency of oscillator is synchronized to that of the incoming reference sync signals while a phase difference or phase error between oscillator output signals and sync signals remains. This phase error is reffered to in the art as static phase error. The ability of conventional phase locked loop systems to make large frequency compensations is accompanied by correspondingly large static phase errors. Thus, practitioners in the art generally must compromise overall system performance to provide the necessary frequency compensation characteristic at the expense of static phase error.

In attempting to minimize or overcome the need for such compromise of system performance, and thereby accommodate a wider range of scan frequencies, partitioners in the art have endeavored to provide improved more flexible systems. Such attempts have included multiple loop control systems and systems which alter the effective control loop gain in response to frequency lock or out of lock conditions. While such attempts have improved certain aspects of the system performance, they have often been beset by difficulties associated with increased complexity and/or transition difficulties between the in-sync and out-of-sync condition of system operation. In addition, systems attempting to make broad range frequency adjustments may create transition conditions which are capable of damaging the tuned subsystems and related components within the scan and high voltage circuits of the television receiver or monitor. There remains, therefore, a need in the art for an improved horizontal scan oscillator control system which is capable of use in a wide range of scan freqencies while concurrently minimizing the danger of damage to system components during frequency transition.

Accordingly, it is general objects of the present invention to provide an improved horizontal scan oscillator control system operable in response to a broad range of scan frequencies. It is a more particular object of the present invention to provide an improved horizontal oscillator control system which responds to broad frequency signals while avoiding system damage during large frequency transitions.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

FIG. 3 sets forth a sample look-up table of oscillator ranges and frequencies in accordance with the present invention.

DESCRIPTION OF THE PREFERRED EMBODIMENT

Figure 1:
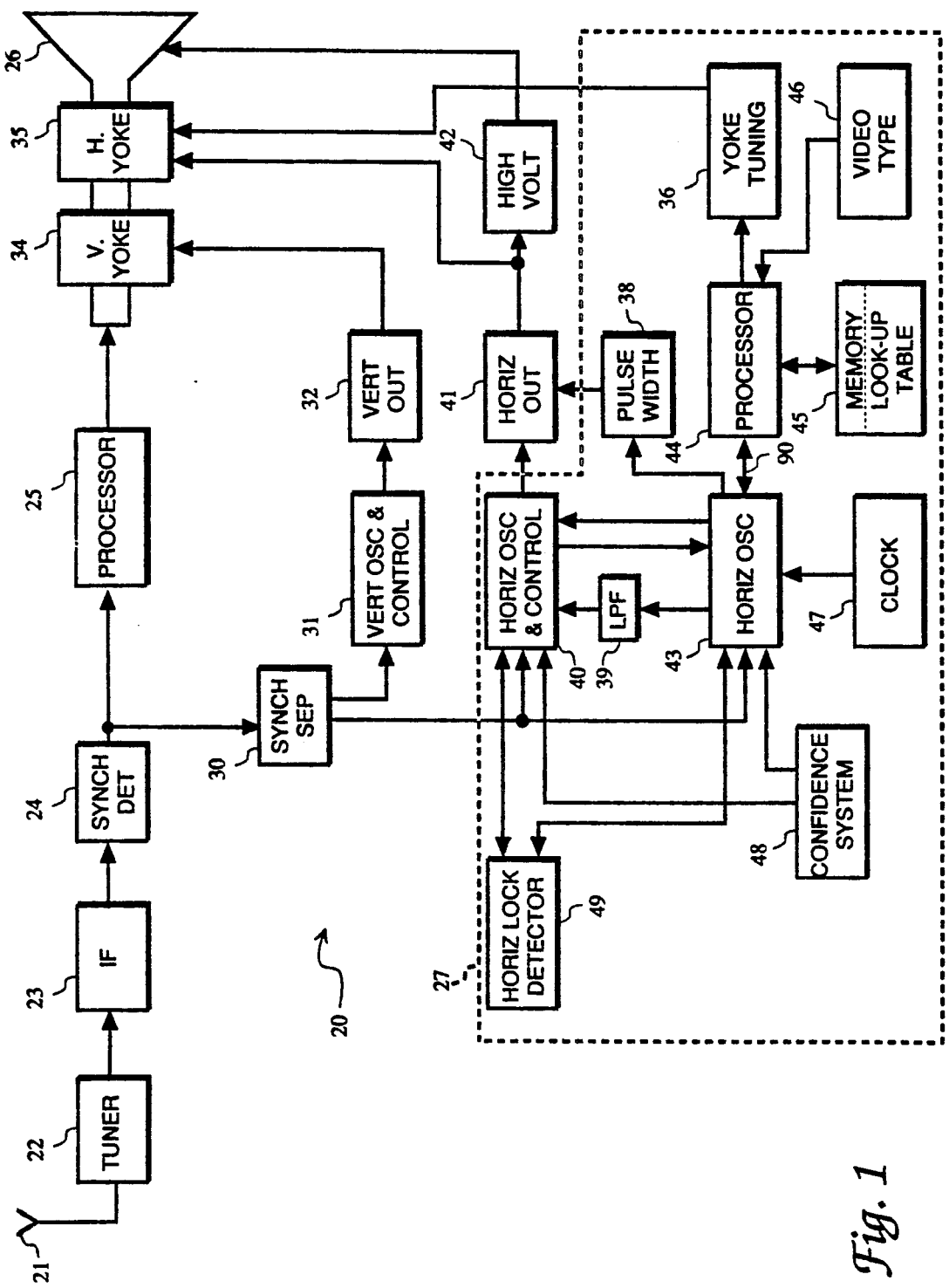
FIG. 1 sets forth a block diagram of a television receiver constructed in accordance with the present invention.

FIG. 1 sets forth a block diagram of a television receiver constructed in accordance with the present invention and generally referenced by numeral 20. Receiver 20 includes a receiving antenna 21 coupled to a turner 22. Tuner 22 is coupled to an intermediate frequency system 23 which in turn is coupled to a synchronous detector 24. A signal processor 25 which includes conventional systems for processing picture and sound information is coupled to a cathode ray tube 26. A sync signal separator 30 is coupled to the output of synchronous detector 24. A vertical scan oscillator and control system 31 is coupled to sync separator 30 and a vertical output amplifier 32. The latter is coupled to a vertical deflection yoke 34. A horizontal scan oscillator and control system 40 includes a variable low pass filter 39 and is coupled to sync separator 30 and a horizontal output amplifier 41. The latter is coupled to a horizontal deflection yoke 35 having an associated yoke tuning circuit 36. Horizontal output amplifier 41 is also coupled to a high voltage generator 42. High voltage generator 42 produces the high voltage potential required for display 26. A pulse width control 38 is coupled to horizontal output amplifier 41 to control the relative conduction time thereof during the scan cycle.

A horizontal oscillator range system constructed in accordance with the present invention and referenced by numeral 43 is coupled to horizontal oscillator and control 40. A clock circuit 47 is coupled to horizontal oscillator range control system 43. A processor 44, which in its preferred form comprises a conventional microprocessor, is coupled to horizontal oscillator range system 43 by a multiple line coupling 90 and to yoke tuning circuit 36. Processor 44 includes a processor memory 45 which is coupled to processor 44 by a multiple line coupling 91. Memory 45 in turn includes a look-up table to be described below in greater detail. Horizontal oscillator range system 43 is further coupled to low pass filter 39 and pulse width circuit 38.

A source of video-type information 46 is coupled to processor 44. A horizontal lock detector 49 is coupled to horizontal oscillator and control 40 and to horizontal oscillator range system 43. A confidence system 48 is coupled to horizontal oscillator range and control 40 and horizontal oscillator range system 43. To facilitate the discussions which follow, horizontal oscillator and control 40, horizontal oscillator range system 43, processor 44, memory 45, video-type source 46, clock circuit 47, confidence system 48 and horizontal lock detector 49 form the inventive oscillator circuit set forth in the above-referenced copending application and are collectively grouped within the dashed line area of FIG. 1 and will be generally referred to as adaptive horizontal scan system 27 in the discussions which follow. Low pass filter 39, pulse width circuit 38 and yoke tuning network 36 cooperate with adaptive horizontal scan system 27 and are controlled thereby in accordance with an important aspect of the present invention. The remainder of television receiver 20 may be constructed in accordance with virtually any of the known conventional fabrication techniques.

Accordingly, antenna 21 receives one or more broadcast television signals which are applied to tuner 22. Tuner 22 includes conventional selection systems for selecting the desired one of the plurality of signals received by antenna 21 and for converting the selected signal to an intermediate frequency signal which is further processed by intermediate frequency processor 23. Synchronous detector 24 operates upon the intermediate frequency signal to recover the picture, sound, and scan synchronizing signals modulated thereon. The picture information is further processed by signal processor 25 to produce appropriate picture information signals to control display 26.

Sync separator 30 extracts the vertical and horizontal scan synchronizing signals from the composite signal at the output of synchronous detector 24 and applies them to vertical scan oscillator and control 31, horizontal scan oscillator and control 40 and to horizontal range system 43. In response to the applied vertical scan signals from sync separator 30, vertical oscillator and control 31 produces a synchronized vertical scan signal which is amplified by vertical scan output system 32 and applied to display 26 to produce the vertical scan thereof.

The operation of the present invention system for properly sequencing the tuning changes within the horizontal scan oscillator, output and yoke circuits in response to adaptive horizontal scan system 27 is best understood by bearing in mind that scan control system 27 is capable of responding to a wide variety of television broadcast signal formats as well as a variety of non-broadcast uses such as color monitors or other display drive systems. To accomplish that feat, scan control system 27 divides the spectrum of frequencies to be encountered into a plurality of oscillator frequency ranges. Thereafter, the system examines the horizontal synchronization signals if a nonstandard signal is being processed or the known scan frequency if a standard signal is received to identify the oscillator frequency range and establish a first approximation of horizontal osciallator frequency. The oscillator frequency is then adjusted to a second frequency approximation until the horizontal oscillator remains within the established frequency range for a predetermined period of time. Finally, the system activates a phase-locked loop and operates to minimize the static phase error within the loop in a final frequency adjustment.

Because horizontal yoke 35 and low pass filter 39, as well as the conduction interval of horizontal output amplifier 41 are tuned or frequency dependent, each must be adjusted to properly function at any selected frequency within this broad range of frequencies. Accordingly, tuning network 36, pulse width circuit 38 and filter 39 are controlled by horizontal oscillator range system 43 and processor 44. In accordance with an important aspect of the present invention, the sequence of these changes are properly phased with the changes of scan frequency in the manner set forth below to avoid system damage which might otherwise result.

More specifically, the horizontal synchronization signals produced by sync separator 30 are applied to horizontal oscillator and control 40 and to horizontal oscillator range system 43. In addition, a video-type signal which identifies the type of signal being received (ie. NTSC, PAL, HDTV, or Monitor) is applied to processor 44. For standard broadcast signals, the horizontal scan frequency is known and the correct oscillator range can be determined directly. However, for nonstandard or monitor-type signals, the horizontal scan frequency is not known and a known relationship between the color subcarrier and the horizontal scan does not exist. Therefore, in such case, horizontal oscillator range system 43 responds to the applied horizontal sync signals and counts the number of clock signals from clock circuit 47 which occur during the period between horizontal sync signals. This number of clock signals occurring during the sync interval provides a convenient number for referencing the synchronization signal frequency and is coupled to processor 44. As is set forth below in FIG. 3 in greater detail, the look-up table within memory 45 of processor 44 provides an organized correlation between this clock signal number and the oscillator frequency range within which the oscillator must be operated for synchronization. In addition, the look-up table within memory 45 provides a corresponding oscillator range control number for each frequency range. Both the clock signal number and the oscillator range control numbers are used by the present invention system to determine both the extent and direction of scan frequency changes being imposed upon the scan control system. Each time processor 44 examines a clock signal number, it determines whether a change has occurred. If a change has occurred, processor 44 inhibits any change of oscillator frequency until the nature of the change has been examined. Initially, processor 44 determines whether a new oscialltor frequency range will be used and how it relates to the previous frequency range. Finally, the adjustments of tuning network 36, pulse width circuit 38 and filter 39 are carried forward in the appropriate timing relationship to the change of oscillator frequency. Frequency changes are initiated by processor 44 in its examination of the look-up table within memory 45 and coupling of the corresponding oscillator range control number to horizontal oscillator range system 43. Horizontal oscillator range system 43 converts the oscillator range control number to an analog control signal which is applied to horizontal oscillator and control 40 to establish a first frequency approximation for the system's horizontal scan oscillator. The process is iterative and the system moves incrementally to the correct frequency range with each increment being accompanied by properly timed changes of yoke tuning, low pass filter tuning and horizontal output amplifier drive.

Thereafter, the adjustments of tuning network 36, filter 39 and pulse width circuit 38 are maintained so long as the oscillator frequency range remains unchanged and the system provides a second frequency approximation by either of two different operations depending upon the type of signal applied. In the event a broadcast type signal is applied, processor 44 and horizontal range control system 43 then compare the horizontal oscillator frequency to the maximum and minimum frequencies of the appropriate frequency range and implement a second frequency adjustment upon the horizontal oscillator within horizontal oscillator and control 40 until the oscillator frequency is within the appropriate frequency range.

If, on the other hand, the system is responding to a monitor signal, the second frequency approximation must be carried forward differently due to the lack of a known standard by which the frequency maximum and minimum may be known. Thus, to provide the second frequency approximation in response to monitor-type signals, horizontal oscillator range system 43 examines a sample of oscillator signals which has been frequency multiplied by some convenient multiplying factor. Different factors may be selected, however, it has been found advantageous to utilize a signal which is sixty four times the horizontal scan frequency of the system. Thus, horizontal oscillator range system 43 counts the number of frequency multiplied signals which occur between horizontal synchronization signals from sync separator 30. Thereafter, horizontal oscillator range system 43 adjusts the oscillator frequency within oscillator and control 40 until the number of frequency multiplied signals between horizontal sync signals corresponds to the predetermined multiplier (i.e. sixty four). In other words, if a frequency multiplied signal of sixty four times the horizontal scan frequency is used, the second approximation of oscillator frequency is achieved by adjusting oscillator frequency until sixty four pulses are counted between horizontal sync signals.

In either event (broadcast signal or monitor signal reception), confidence system 48 is activated following the second frequency approximation. Confidence system 48 determines whether the horizontal oscillator within oscillator and control 40 remains within the desired frequency range for a predetermined interval to establish confidence in the second frequency approximation. Once confidence is established, confidence system 48 produces an enabling signal which is coupled to oscillator and control 40 and to horizontal oscillator range system 43 to enable the phase locked loop within horizontal oscillator and control 40 (described below). As a result, the phase locked loop within horizontal oscillator and control 40 establishes frequency synchronization of the horizontal oscillator with the horizontal synchronization signals from sync separator 30. Lock detector 49 responds to the establishment of horizontal synchronization or lock and causes horizontal oscillator range system 43 to transfer the control of the horizontal scan oscillator entirely to horizontal oscillator and control system 40. Thereafter, horizontal oscillator and control 40 functions in the manner described below in greater detail to minimize static phase error and maintain frequency and phase synchronization between the horizontal scan oscillator and the reference horizontal synchronizing signals.

The synchronized output signals of horizontal oscillator and control 40 are further amplified by horizontal output 41 and applied to display 26 to produce the synchronized horizontal scan of cathode ray tube 26. In addition, high voltage system 42 responds to the output signal of horizontal output 41 to produce a high voltage operating potential for cathode ray tube 26.

Because of the adaptive character of scan control system 27, it will be apparent to those skilled in the art that while the operative environment of FIG. 1 is a television receiver, it may be used with equal benefit in a variety of environments such as computer monitors and video game displays or other display systems.

Figure 2A:
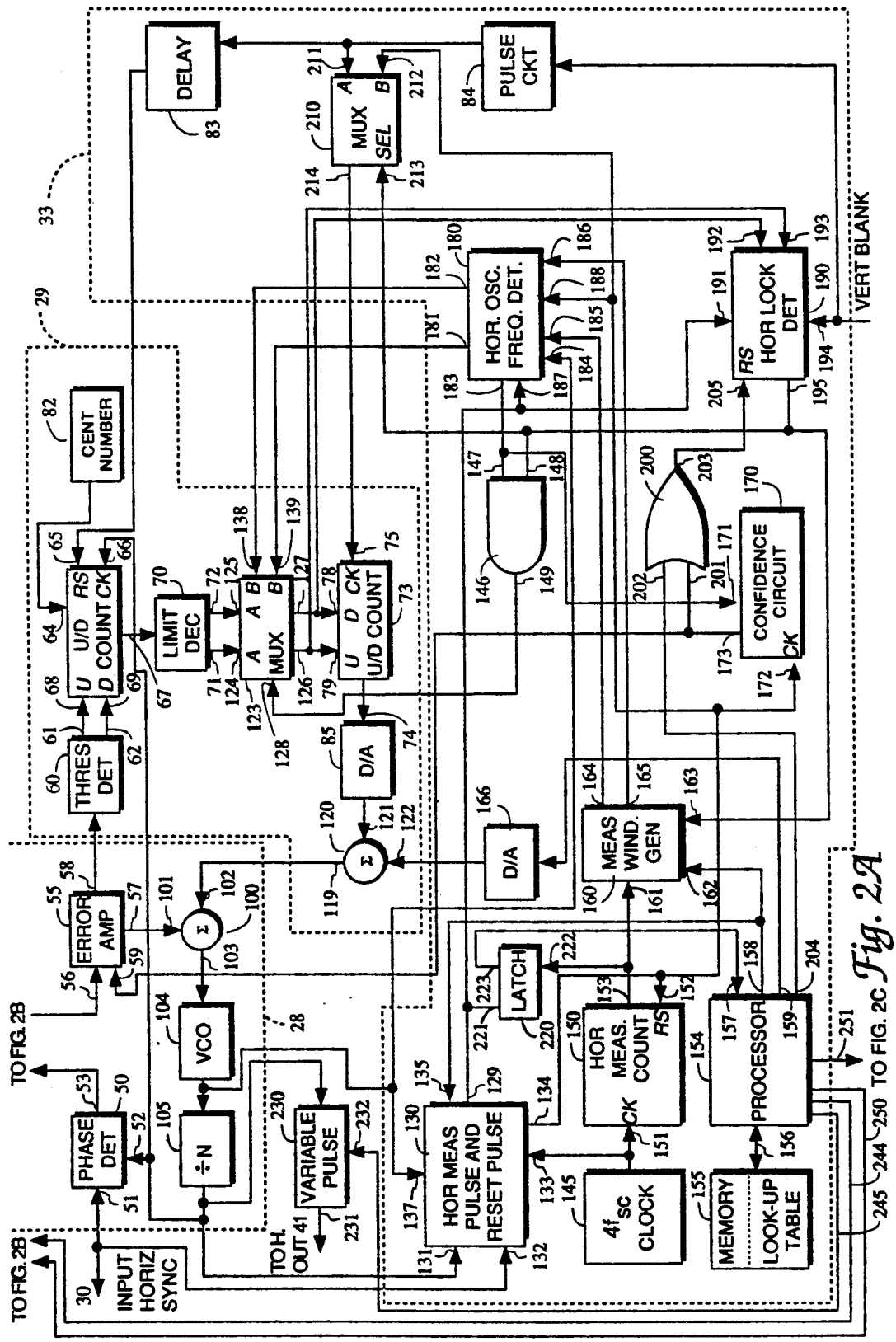
FIG. 2A, 2B and 2C when taken together set forth a block diagram of an adaptive oscillator control system constructed in accordance with the present invention.
Figure 2C:
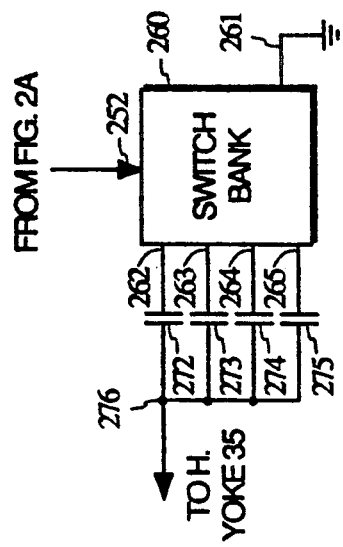
Figure 2B:
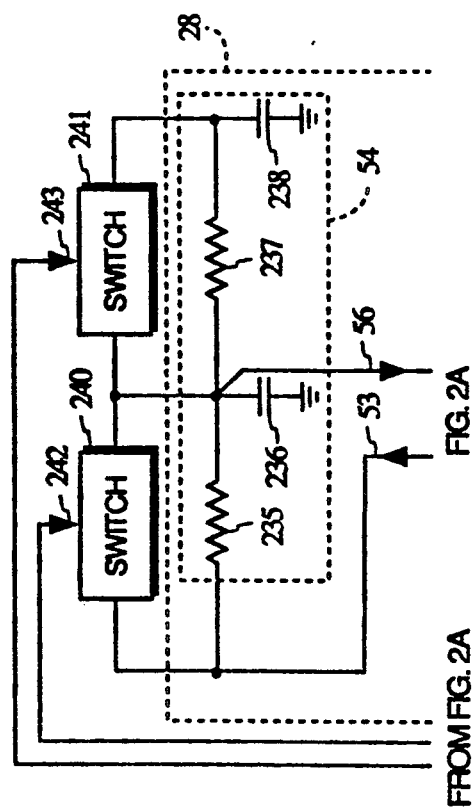

FIGS. 2A, 2B and 2C sets forth a block diagram of the present invention horizontal scan control system generally referenced by numeral 27 in FIG. 1. By way of overview, it should be noted that the present invention system set forth in FIGS. 2A, 2B and 2C when taken together set forms three basic subsystem components which are shown by dashed line markings 28, 29 and 33. The portion of the present invention system enclosed within dashed line 28 comprises a phase locked loop which is operative to maintain the instantaneous or high speed corrections of the present invention system. The portion enclosed within dashed line reference 29 forms a static error corrector which responds to long term corrections within phase locked loop 28. In accordance with the above-referenced related application, the combination of phase locked loop 28 and static error corrector 29 cooperate to minimize the static phase error within the system once phase locked loop 28 has achieved frequency and phase lock. The remainder of the system of FIG. 2 enclosed within dashed line 33 provides the above-described adaptive function of the present invention system which enhances the performance of phase locked loop 28 and static error corrector 29 to accommodate a broad range of synchronization frequencies and both broadcast and monitor type signals.

With respect to phase locked loop 28, a phase detector 50 which may be constructed in accordance with conventional fabrication techniques, includes an input 51 coupled to sync separator 30 (seen in FIG. 1), an input 52 and an output 53. A low pass filter 54 includes a pair of series resistors 235 and 237 and a pair of shunt capacitors 236 and 238. A pair of switch circuits 240 and 241 are coupled in parallel to resistors 235 and 237 respectively. Resistor 235 is coupled to phase detector output 53. Switch circuits 240 and 241 include control inputs 242 and 243 respectively which are coupled to outputs 245 and 244 of processor 44. An error amplifier 55 includes an input 56 coupled to the junction of resistor 235 and capacitor 236 within low pass filter 54, an enabling signal input 59, and a pair of outputs 57 and 58. A summing network 100 includes an input 101 coupled to output 57 of error amplifier 55, an input 102 and an output 103. A voltage controlled oscillator 104 is coupled to output 103 of summing network 100 and to a frequency divider 105. The latter is coupled to horizontal output 41 (seen in FIG. 1) and to input 52 of phase detector 50.

Static phase error corrector 29 includes threshold detector 60 coupled to output 58 of error amplifier 55 and having a pair of outputs 61 and 62. An up/down counter 63 includes an up-counting input 68 coupled to output 61 of threshold detector 60 and a down-counting input 69 coupled to output 62 of threshold detector 60. Up/down counter 63 further includes reset input 65, a clock signal input 66 and an input 64 and an output 67. A limit decoder 70 is coupled to output 67 of up/down counter 63 and includes a pair of outputs 71 and 72. A multiplexer 123 includes a pair of inputs 124 and 125 coupled to outputs 71 and 72 respectively, a pair of inputs 138 and 139, a pair of outputs 126 and 127, and a selection input 128. An up/down counter 73 includes an up-counting input 79 coupled to output 126 of multiplexer 123 and a down-counting input 78 coupled to output 127 of multiplexer 123. Up/down counter 73 further includes an output 74 coupled to a digital to analog converter 85 and a clock signal input 75. A summing network 120 includes an input 121 coupled to converter 85, an input 122, and an output 119 coupled to input 102 of summing network 100. A pulse circuit 84 is coupled to vertical oscillator and control 31 (seen in FIG. 1). The output of pulse circuit 84 is coupled to an input of multiplexer 210, the output of which is coupled to clock signal input 75 of up/down counter 73. The output of pulse circuit 84 is further coupled to a delay network 83. The output of delay network 83 is coupled to reset signal input 65 of up/down counter 63. A center number source 82 is coupled to data input 64 of up/down counter 63.

As mentioned above, the remainder of the present invention system within dashed line 33 provides the multiple frequency operation of the present invention system which includes a horizontal measuring pulse and reset generator 130. Generator 130 includes an input 131 coupled to a source of horizontal oscillator signal at frequency divider 105, an input 132 coupled to a source of horizontal synchronization signal from sync separator 30 (seen in FIG. 1), an input 137 coupled to the output of oscillator 104. In addition, generator 130 includes an input 135 coupled to processor 154, output 158, an input 133 coupled to clock 145 and a pair of outputs 134 coupled to reset 152 of counter 150 and 129 coupled to input 221 of latch 220. Latch 220 further includes an input 222 coupled to output 153 of counter 150 and an output 223 coupled to input 157 of processor 154. A horizontal measuring counter 150 includes an output 153, a reset input 152 and a clock input 151. A clock circuit 145 produces a periodic clock signal and is coupled to input 133 of generator 130 and input 151 of horizontal measuring counter 150. Output 134 of generator 130 is coupled to reset input terminal 152 of horizontal measuring counter 150. A processor circuit 154 which, in its preferred form comprises a conventional microprocessor, includes a memory and look-up table 155. In accordance with conventional fabrication techniques, processor 154 and memory 155 are coupled via a multiple line coupling 156. Processor 154 includes an input 157 coupled to output 223 of latch 220, an output 204, an output 158 coupled to input 135 of generator 130 and an output 159 which is coupled to digital to analog converter 166, the output of which is coupled to input 122 of summer 120. An OR gate 200 includes an input 202 coupled to output 204 of processor 154, an input 201 coupled to output 173 of confidence circuit 170 and an output 203 coupled to a reset input 205 of lock detector 190. A measuring window generator 160 includes an input 161 coupled to output 153 of horizontal measuring counter 150, an input 162 coupled to output 158 of processor 154 and an input 163. Measuring window generator 160 further includes a pair of outputs 164 and 165. A confidence circuit 170 includes a clock signal input 172 coupled to output 134 of generator 130 and an output 173 coupled to input 59 of error amplifier 55. Confidence circuit 170 further includes an input 171 coupled to output 183 of horizontal oscillator frequency detector 180. Frequency detector 180 includes a reset input 188 coupled to output 134 of generator 130, a pair of inputs 185 and 186 coupled to outputs 164 and 165 of measuring window generator 160, and an output 183 coupled to input 171 of confidence circuit 170 and to input 147 of AND gate 146. Horizontal oscillator frequency detector 180 further includes a pair of outputs 181 and 182 coupled to inputs 139 and 138 respectively of multiplex circuit 123 and input 187 coupled to output 129 of generator 130. A horizontal lock detector 190 includes an input 191 coupled to output 129 of generator 130, an input 194 coupled to a source of vertical blanking signals (not shown), and a pair of inputs 192 and 193 coupled to outputs 127 and 126 respectively of multiplex circuit 123. Horizontal lock detector 190 further includes an output 195 coupled to input 163 of measuring window generator 160 and to input 148 of AND gate 146. The vertical blanking pulse applied to input 194 of horizontal lock detector 190 is further coupled to a pulse circuit 84, the output of which is coupled to input 211 of multiplexer 210 and to delay network 83. Multiplexer 210 includes an input 212 coupled to the output 134 of generator 130 and a selector input 213 coupled to the output 195 of horizontal lock detector 190. Multiplexer 210 includes an output 214 coupled to clock input 75 of counter 73.

In operation and by way of overview, the function of the present invention adaptive horizontal scan oscillator and control is believed best understood by initially noting that the adaptive portion of the system within dashed line 33 determines the appropriate frequency range for the horizontal oscillator 104 and then provides first frequency approximation adjustments to bring the frequency of oscillator 104 into the appropriate frequency range and close enough to the correct frequency to achieve initial synchronization. In accordance with an important aspect of the present invention, the first approximation of frequency is carried forward as a series of incremental changes each followed by an appropriate and properly phased or timed changes of horizontal yoke tuning, low pass filter tuning, and horizontal output amplifier drive signal. Thereafter, the second "finer" frequency approximation is performed and the phase locked loop formed by combination of phase detector 50, low pass filter 54, error amplifier 55, voltage controlled oscillator 104 and frequency divider 105 is enabled and responds to changes of oscillator frequency or phase in a generally conventional manner. In the final operation, summing network 100 and the static phase error portion of the system within dashed line 29 responds to longer duration oscillator errors to reduce or eliminate static phase error.

With this overview, the present invention system may be understood in greater detail. Upon the activation of the host television receiver or monitor type environment in which the system of FIG. 2 is operated, several initial actions take place more or less simultaneously. A succession of horizontal synchronization signals are separated from the received signal and applied to horizontal measuring pulse and reset pulse generator 130. Clock circuit 145 produces crystal controlled stable periodic high frequency clock signals. While the frequency of clock signals selected for clock circuit 145 is, to some extent, a matter of design choice, it has been found advantageous to utilize a clock signal frequency equal to four times that of the NTSC chrominance subcarrier or approximately fourteen megahertz. Thus, clock 145 produces clock signals which are applied to horizontal measuring pulse and reset pulse generator 130, and to horizontal measuring counter 150. Measuring counter 150 counts the number of clock signal pulses between resets. In addition, processor 154 produces a video-type indicative signal which is coupled to generator 130 and to measuring window generator 160. The purpose of the video-type signal is to provide an indication to the system as to the signal format being applied. Any number of conventional systems may be used to input the video-type information to processor 154, including a user switch setting. Initially, the video-type information allows the system to either go to the appropriate oscillator range for standard signals or use the following procedure for nonstandard monitor-type signals. Thus, in accordance with an important aspect of the present invention when a nonstandard signal is received, horizontal measuring counter 150 accumulates a count of input clock signal pulses which is reset at the horizontal sync signal rate by the output 134 of generator 130. Because the output signal of generator 130 is timed to the applied horizontal synchronization signals, the periodic reset of counter 150 produces a series of output counts at output 153 corresponding to the number of clock signal pulses occurring between horizontal sync signals. The horizontal measuring counter output 153, just prior to reset is latched by latch 220 and the latched output 222 is therefor indicative of the horizontal sync signal frequency and is coupled to processor 154 which, in accordance with the present invention, utilizes a look-up table within memory 155 to convert the output count of counter 150 to the corresponding oscillator range code number for nonstandard or monitor-type signals.

A typical look-up table may be seen in the table of FIG. 3 showing the spectrum of frequencies to which the present invention system is intended to respond divided into sixteen oscillator frequency ranges. In further accordance with the present invention, each frequency range has an assigned oscillator range code number which, in the embodiment of FIG. 2, comprises a four-bit digitally encoded number. Thus, processor 154 is able to convert the number of clock signals of a nonstandard signal occurring between horizontal sync pulses and counted by counter 150 to a four-bit digitally encoded number indicative of the frequency range within which the horizontal synchronization signals are found. As mentioned, the oscillator range code of a standard signal is known and may be selected by processor 154 in response to video type. Processor 154 thereafter couples the four-bit digitally encoded oscillator range code number to digital-to-analog converter 166 which, in accordance with conventional fabrication techniques, converts the oscillator range code number to a corresponding analog signal which is applied to summing network 120. The analog signal produced by digital-to-analog converter 166 is coupled to oscillator 104 via summing networks 120 and 100 to produce an initial control signal and establish the first frequency approximation for voltage controlled oscillator 104.

Figure 4:
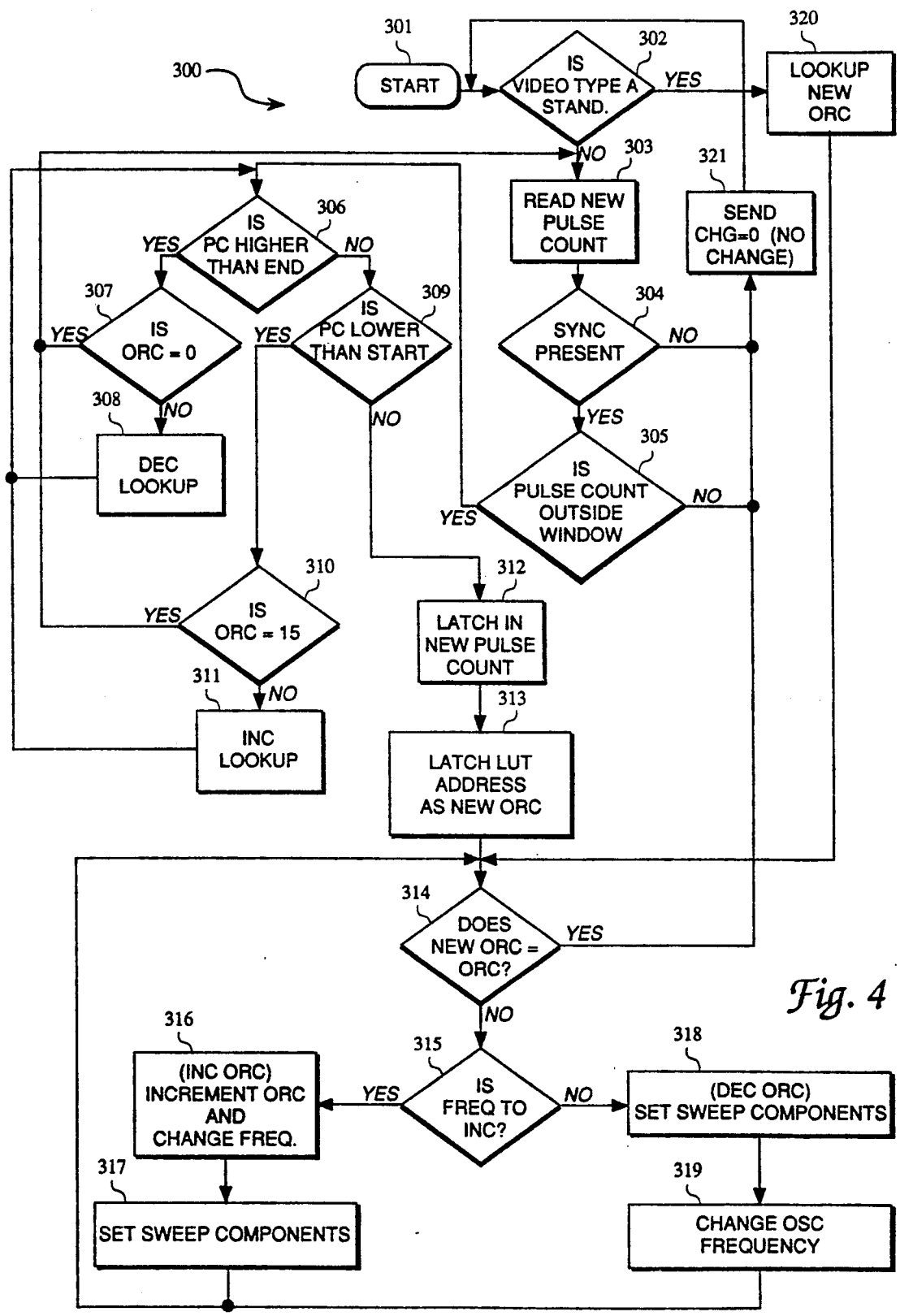
FIG. 4 sets forth a flow diagram of the operation of the present invention sequenced oscillator frequency and change of scan system.

Regardless of whether the correct oscillator range is determined directly for a standard signal or using the above-described system for nonstandard signals, the actual frequency change of oscillator 104 is carried forward in accordance with the procedure shown in the flow diagram of FIG. 4. As is shown therein and as is described below, the system moves to the correct oscillator frequency range in a series of incremental discrete changes. In association with each frequency change, some or all of the external elements of horizontal yoke tuning, drive signal to the horizontal output amplifier, and low pass filter tuning will be adjusted as needed to protect the system from damage.

Changes of tuning for low pass filter 54 are provided by actuation of switches 240 and 241 in response to output signals from processor 154. Switches 240 and 241 may, for example, include alternative resistance elements switched into or out of parallel with resistors 235 and 237 to shift the time constant of filter 54 as needed.

Changes of drive signal to horizontal amplifier 41 (seen in FIG. 1) are provided under control of processor 154 by changing the pulse duration of signal produced by pulse circuit 230. While a number of variable pulse width circuits can be used for circuit 230, it may in its simplest form include one or more multivibrator or flip-flop circuits.

Changes of tuning for horizontal yoke 35 (seen in FIG. 1) are provided by processor controlled changes of the "S-shaping" capacitor typically found in most deflection yokes. Specifically, a plurality of S-shaping capacitors 272, 273, 274 and 275 are commonly coupled to yoke 35 at one end and to a switch bank 260 at the other end. In accordance with conventional operation, a single capacitor or combination of capacitors 272 through 275 may be coupled to ground connection 261 in response to the applied signal of processor 154 thereby tuning yoke 35.

With the initial frequency approximation performed, oscillator 104 produces an output signal which is approximately sixty four times the desired horizontal oscillator output signal to be utilized by the remainder of the system. Frequency divider 105 converts the output of oscillator 104 to a horizontal oscillator output signal which is coupled to horizontal measuring pulse and reset pulse generator 130 and to phase detector 150. At this point, an initial frequency approximation for oscillator 104 has been performed by the present invention system in establishing an initial oscillator range and applying a first approximation current to oscillator 104.

With the appropriate oscillator frequency range established and the first approximation of oscillator frequency applied, the second frequency approximation is carried forward by the present invention system. It should be noted that this second approximation involves a "finer" or more narrow frequency adjustment than provided by the first frequency approximation. It should also be noted that the second frequency approximation uses either of two processes which are determined by the type of signal being processed. As mentioned above, processor 154 produces an output signal indicative of the video-type or type of signal format being applied (e.g. NTSC, PAL, HDTV or Monitor). This video-type signal is applied to horizontal measuring pulse and reset pulse generator 130 which produces the appropriate horizontal sync measuring pulse and horizontal measuring counter reset pulse. In addition, the output of horizontal measuring counter 150 together with the video-type signal are coupled to measuring window generator 160. Measuring window generator 160 responds to the video-type signal and to the output count of measuring counter 150 to produce a pair of output signals at outputs 164 and 165 which correspond to the frequency maximum and frequency minimum of the oscillator frequency range determined by the output count of counter 150. These frequency maxima and frequency minima signals are applied to horizontal frequency detector 180.

Frequency detector 180 also receives the horizontal sync measuring pulse at input 187 and the output of oscillator 104 at input 184. The horizontal sync measuring pulse applied to input 187 comprises a signal corresponding in frequency and phase to the frequency divided horizontal output signal of oscillator 104 having a pulse width determined in accordance with the type of signal format being processed. It should be noted that oscillator 104 operates at a frequency which is sixty four times the desired horizontal output signal. As mentioned above, the second frequency approximation is also carried forward using one process in response to television broadcast signals such as NTSC, PAL, or HDTV or in an alternative process in the event a monitor type or non-standard input signal is applied.

In response to a broadcast type signal, the frequency maxima and frequency minima signals produced by measuring window generator 160 provide a pair of timing signals which are used by oscillator frequency detector 180 to determine the frequency relationship between the horizontal sync measuring pulse and the desired oscillator frequency range. This determination is carried forward by examining the timing relationship between the horizontal sync measuring pulse at input 187 and the frequency maxima and minima signals at inputs 185 and 186 respectively. Thus, in the event the horizontal sync measuring pulse occurs earlier than the frequency maxima signal at input 185, detector 180 determines that the frequency of oscillator 104 is above the desired frequency range and thus oscillator 104 leads the desired frequency range. Conversely, if the horizontal sync measuring pulse occurs after the frequency minima signal at input 186, detector 180 determines that the frequency of oscillator 104 is below the desired frequency range and thus lags the desired range. Finally, if the horizontal sync measuring pulse occurs between the frequency maxima and minima signals, oscillator 104 is within the desired frequency range, or simply, in range. Thus, horizontal oscillator frequency detector 180 compares the timing of the horizontal sync measuring pulse to the frequency maxima and frequency minima signals produced by measuring window generator 160 and provides output signals indicating whether oscillator 104 leads, lags, or is within the desired frequency range. An output signal at output 181 of frequency detector 180 indicator indicates oscillator 104 is leading or above the desired frequency range while an output signal at output 182 indicates that oscillator 104 is lagging or below the desired frequency range. An output signal at output 183 indicates that oscillator 104 is within the desired frequency range.

The oscillator leading or oscillator lagging signals of frequency detector 180 are coupled to inputs 138 and 139 of a multiplex circuit 123. The oscillator in range output signal is coupled to input 147 of AND gate 146. The remaining input 148 of AND gate 146 is coupled to output 195 of horizontal lock detector 190. The operation of horizontal lock detector 190 is described below in greater detail. However, suffice it to note here that output 195 of lock detector 190 produces an output signal when oscillator 104 is locked or in sync. AND gate 146 includes an output 149 which is coupled to selection input 128 of multiplex circuit 123. Multiplex circuit 123 is constructed in accordance with conventional fabrication techniques and is, in essence, a switch which alternatively couples either inputs 138 and 139 or inputs 124 and 125 to outputs 126 and 127 respectively. In the absence of a signal at selection input 128, multiplex circuit 123 couples inputs 138 and 139 to outputs 126 and 127 which in turn are coupled to up-counting input 79 and down-counting input 78 of counter 73. The oscillator in range signal of frequency detector 180 is also coupled to input 171 of confidence circuit 170.

Thus, frequency detector 180 examines the timing of successive horizontal sync measuring pulses and produces output signals at either outputs 181 or 182 indicative of the frequency relationship between oscillator 104 and the desired frequency range. If, for example, oscillator 104 is too high in frequency, the comparison of horizontal sync measuring pulse and the frequency maxima signal input to detector 180 described above produces an output signal at output 181 which is coupled to down-counting input 78 of counter 73 through multiplex circuit 123. In response, counter 73 decreases its output count so long as a down-counting signal is applied to terminal 78. Conversely, in the event oscillator 104 is lower in frequency than desired, detector 180 produces an output signal at output 182 which is coupled by multiplex 123 to up-counting input 79 of counter 73 causing its output count to be increased. The output count of counter 73 is applied to digital to analog converter 85 which produces a corresponding analog control signal which is combined with the control signal from digital-to-analog converter 166 within summer 120. The output of summer 120 which now includes both the first frequency approximation control current produced by digital-to-analog converter 166 and an adjusting current corresponding to the output count of counter 73 is applied to oscillator 104 via summing network 100 to produce a further frequency correction. This process continues as frequency detector 180 continues to examine the horizontal sync measuring pulse timing and alter the output count of counter 73 accordingly to produce a further correction current. At some point in this process, equilibrium is reached and the frequency of oscillator 104 is found to be within the desired frequency range causing detector 180 to produce an oscillator in range signal at output 183. This oscillator in range signal causes confidence circuit 170 to initiate the confidence examination process described below. In addition, the oscillator in range signal produces one of the necessary inputs to activate AND gate 146. The remaining input, however, remains unavailable until horizontal synchronization or lock is detected in the manner described below. At this point, however, no selection signal is applied to selection input 128 of multiplex circuit 123 and thus inputs 138 and 139 remain coupled to outputs 126 and 127. So long as frequency detector 180 continues to determine that the frequency of oscillator 104 is within range, no further correction signals are produced or applied to counter 73. Thus, so long as oscillator 104 remains in range, the output count of counter 73 remains unchanged and the control signal applied to input 121 of summer 120 remains similarly unchanged. At this point, the second frequency approximation for oscillator 104 is complete and the frequency of oscillator 104 is determined by the combined control signals produced by digital-to-analog converters 166 (first approximation) and digital-to-analog converter 85 (second approximation).

In accordance with an important aspect of the present invention, phase lock loop 28 has remained inoperative during the first and second frequency approximations and will continue to remain inoperative until confidence circuit 170 produces an enabling signal at output 173 which is applied to enabling input 59 of error amplifier 55. Confidence circuit 170 may be provided in a number of circuit configurations and may function in response to a variety of confidence criteria. The essential function of confidence circuit 170 is to provide an indication that the above-described first and second frequency approximations have correctly placed the frequency of oscillator 104 within the appropriate oscillator frequency range. In the circuit shown in FIG. 3, confidence circuit 170 utilizes the horizontal rate reset signal of measuring counter 150 to establish a predetermined interval during which the oscillator in range signal at input 171 must be continuously maintained in order for confidence circuit 170 to produce an output signal at output 173. This output signal then enables error amplifier 55 of phase lock loop 28 once sufficient confidence has been established.

The operation of measuring window generator 160 and horizontal oscillator frequency detector 180 is carried forward in a different manner in response to a monitor-type input signal. This alternative operation is required because of the absence of a known standard for monitor-type signals. Thus, upon completion of the above-described determination of the appropriate oscillator frequency range and the establishment of the initial control current by converting the corresponding oscillator control range number to an appropriate control current by digital-to-analog converter 166, frequency detector 180 performs the second frequency approximation for monitor-type signals by counting the number of input pulses applied to input 184 between the occurrence of horizontal sync measuring pulses at input 187. It is desired that the frequency of oscillator 104 be sixty four times that of the incoming horizontal sync signals. Thus, in the event frequency detector 180 counts more than sixty four input pulses at input 184 between horizontal sync measuring pulse inputs at input 187, an oscillator leading condition has been detected and a correcting signal is produced at output 181. Conversely, in the event frequency detector 180 counts fewer than sixty four input pulses at input 184 between horizontal sync measuring pulses, an oscillator lagging or too slow condition has been detected and a corresponding correction signal is applied to output 182. The operation of multiplex circuit 123 and up/down counter 73 in response to the output signals of frequency detector 180 in the monitor mode of operation is identical to that set forth above and thus the output count of counter 73 is adjusted until the control signal resulting from the conversion of the output count of counter 73 and applied to oscillator 104 alters the frequency of oscillator 104 to produce approximately sixty four pulse signals at input 184 between horizontal sync measuring pulses. At this point, frequency detector 180 produces an oscillator in range signal at output 183 which is processed by confidence circuit 170 in the manner described above until a predetermined confidence is established and phase lock loop 28 is activated by enabling amplifier 55. Once confidence has been established and phase lock loop 28 has been enabled, the system again performs in the same manner regardless of which type of signal input is provided. Thus, the enabling of error amplifier 55 by the confidence signal at input 59 closes the operational loop of phase lock loop 28.

Phase detector 50 responds to the simultaneous application of reference horizontal sync signals from sync separator 30 (seen in FIG. 2) and a sample of the frequency divided output of oscillator 104. In accordance with conventional fabrication techniques, phase detector 50 produces an error signal at output 53 which is coupled by low pass filter 54 to the input of error amplifier 55. Amplifier 55 imposes a predetermined signal gain upon the applied error signal which is operative upon voltage controlled oscillator 104 to shift the frequency of oscillation thereof. In further accordance with conventional fabrication techniques, voltage controlled oscillator 104 operates at a predetermined multiple (in this case sixty four) of the desired horizontal scan frequency. Thus, to produce the desired horizontal output signal, the output signal of voltage controlled oscillator 104 is frequency divided by this predetermined frequency multiple. The output signal is coupled to phase detector input 52 and to horizontal output system 41 (seen in FIG. 1). Frequency or phase errors between the sample of frequency divided oscillator output signal at input 52 of phase detector 50 and reference synchronizing signals at input 51 produce appropriate error voltages at output 53 which are amplified and applied to oscillator 104 to adjust the frequency of oscillator 104 until the frequency divided oscillator signal again corresponds in frequency and phase to the reference sync pulses.

Horizontal lock detector 190 includes a pair of inputs 192 and 193 which are coupled to inputs 78 and 79 respectively of counter 73. Lock detector 190 is also coupled to a source of vertical blanking signal at input 194 and a source of horizontal sync measuring pulse at input 191. Horizontal lock detector 190 monitors the input signals to counter 73 and, upon establishing the absence of correcting signal inputs to counter 73 for a predetermined period of time, produces a horizontal lock output signal at output 195. As mentioned above, this horizontal lock signal forms the second input at input 148 of AND gate 146. Thus, with input signals to gate 146 which simultaneously indicate an oscillator in range condition and the attainment of horizontal lock by phase lock loop 28, AND gate 146 produces an output signal at output 149 which is applied to selection input 128 of multiplex 123. In response, multiplex 123 switches the coupling to outputs 126 and 127 away from inputs 138 and 139 respectively to inputs 124 and 125. This switching of multiplexer 123 causes counter 73 to be decoupled from inputs 138 and 139 and further control of counter 73 is provided by the static phase error correction portion of the present invention system enclosed within dashed line 29. Processor 154 produces a high output signal at output 204 in the absence of incoming horizontal sync signals. OR gate 200 resets horizontal lock detector 190 if horizontal sync is absent or if a frequency adjustment is required.

At this point, the present invention system has determined the appropriate frequency range for oscillator 104, completed first and second frequency approximations to place the oscillator within the desired range, established confidence and activated phase locked loop 28 to achieve synchronization. The objective of the remainder of the present invention system is to reduce any static phase error occurring by ignoring short duration or small magnitude frequency and phase correction and instead responding solely to large magnitude frequency corrections having an extended duration. As is set forth in the above identified related application, threshold detector 60 and counter 63 respond to detect large frequency corrections and to average such changes over a vertical scan interval. Limit decoder 70 responds to the occurrence of substantial count changes of counter 63 to produce up-counting or down-counting signals which are coupled by multiplexer 123 to counter 73 changing its output count and the control signal applied to oscillator 104 which, in effect, shifts the static or free-running frequency of oscillator 104 to remove the need for the large magnitude long duration corrections and avoid objectionable static phase error.

More specifically, the output of threshold detector 60 is unresponsive to the phase locked loop error signal unless and until it rises above or drops below a predetermined upper and lower signal amplitude limit. However, in the event the error signal exceeds a predetermined upper threshold or drops below a lower threshold, an output signal is produced at output 61 or 62 of threshold detector 60.

Up/down counter 63 comprises a conventional up-/down counter which responds to an up-counting signal at input 68 to increase its count or to a down-counting signal at input 69 to decrease its count. The clock input of up/down counter 63 is coupled to the output of frequency divider 105. Thus, up/down counter 63 counts upwardly at the horizontal output signal rate whenever input 68 is energized or downwardly whenever input 69 is energized and remains unchanged in the absence of both. In addition, a vertical rate reset pulse is produced by pulse circuit 84 in response to an input vertical blanking signal from vertical oscillator and control 31. This vertical rate reset pulse is delayed by a delay network 83 and applied to reset terminal 65. Also, a predetermined center count number stored in center number circuit 82 is applied to the data input of counter 63 each time a reset pulse is applied to reset input 65. Thus, in normal operation and in the absence of an input signal from threshold detector 60, counter 63 is reset at the vertical scan rate to produce an output count at terminal 67 which corresponds to the predetermined center number stored in circuit 82. This process continues and the output of counter 63 at output terminal 67 remains constant at the predetermined center number so long as no signal is applied to up-counting terminal 68 or down-counting terminal 69. If however, the amplitude of error signal produced by phase detector 50 exceeds either limit, indicating of a large frequency correction of oscillator 104, the output count of counter 63 is changed accordingly.

Limit detector 70 responds to the output count of counter 63 and compares the output count to predetermined high and low count limits. In the event an increased count beyond the upper limit is decoded, output 71 which is coupled to up-counting terminal 78 of counter 73 by multiplexer 123 is energized. Conversely, output counts of counter 63 below the lower limit result in an output signal at terminal 72 which is also coupled to down-counting terminal 79 of counter 73 by multiplexer 123. In the absence of output counts from counter 63 exceeding either count limit, limit decoder 70 does not energize either up-counting terminal 78 or down-counting terminal 79.

Because the output count of counter 73 is converted to a corresponding analog signal by digital to analog converter 85 in the manner described above and applied to input 102 of summer 100, changes of the output count of counter 73 produce corresponding changes of the control signal applied to input 102 of summer 100. The control signal applied to voltage controlled oscillator 104 is the combination of inputs 101 and 102 and therefore, changes at input 102 causes corresponding changes of frequency of voltage controlled oscillator 104.

The output count of counter 73 continues to be adjusted by threshold detector 60, counter 63 and limit decoder 70 until the frequency of oscillator 104 is established at the correct free-running frequency as indicated by the absence of error signals within phase lock loop 28 sufficient to activate threshold detector 60. Thereafter, the control signal provided by counter 73 and digital-to-analog converter 85 together with the oscillator range control derived control signal provided by digital-to-analog converter 166 remain constant and minor frequency and phase corrections are made by phase lock loop 28 to maintain the synchronization of oscillator 104.

FIG. 3 sets forth an exemplary look-up table used by the present invention system and generally referenced by numeral 175. Table 175 includes an address column 179, an ORC column 176, and numeric columns 177 and 178. Column 176 displays the oscillator range control numbers corresponding to the sixteen frequency ranges within which the overall frequency spectrum of the present invention system is required to perform while column 179 shows their addresses. It will be apparent to those skilled in the art that the frequency spectrum of any given system may be divided into different numbers of oscillator ranges without departing from the present invention. Columns 177 and 178 relate to the accumulated clock signal counts derived by horizontal measuring counter 150 (seen in FIG. 2A) which occurred between horizontal synchronization signals in the manner described above. Column 177 sets forth numbers corresponding to the upper frequency limit of each corresponding oscillator range while the numbers set forth in column 178 correspond to the lower limits of each corresponding oscillator frequency range. Examination of table 175 reveals that each oscillator frequency range overlaps the adjacent range. This has been found advantageous in that it provides a hysteresis effect for the present invention system which is necessary to assure that the occurrence of synchronization frequencies at or near the limit of an oscillator frequency range will not cause the system to become unstable and oscillate between ranges. While any number of priority systems may be used to resolve this overlap, it has been found advantageous to configure memory 155 and processor 154 (seen in FIG. 2A) to select the oscillator frequency range which initially is encountered.

FIG. 4 sets forth a flow chart of the present invention system operation generally referenced by numeral 300. The process begins at a starting point 301 and moves to an initial decision step 302 in which a determination is made as to whether the signal applied is a standard video-type signal or nonstandard signal source such as a monitor or the like. In the event a standard signal is present, the system moves to a step 320 in which the oscillator range code (ORC) is obtained from the look-up table within memory 155 of processor 154 (seen in FIG. 2A). Following the obtaining of the new ORC number, the system moves to a decision step 314 in which a determination is made as to whether the new ORC number is equal to the previous ORC number. If the new ORC number is equal to the previous ORC number, the system moves to step 321 in which indication is given to the processor that no change of oscillator range code is required afterwhich the system returns to step 302 and the process is repeated.

If, however, a determination is made at step 314 that the new oscillator range code is different from the previous oscillator range code indicating a change is required, the system moves to a decision step 315 in which a determination is made as to whether frequency is to increase in transitioning to the new oscillator range code. If a frequency increase is to be required, the system moves to a step 316 in which the oscillator range code or ORC number stored is incremented and the oscillator frequency is changed by a corresponding increment. Thereafter, the system moves to a step 317 in which the external sweep components are changed to the extent necessary to accommodate the incremental frequency change. In the embodiment shown in FIG. 2A, the sweep components changed include low pass filter 54 of phase locked loop 28, variable pulse drive circuit 230, and the tuning of horizontal yoke 35. This change of sweep components is carried forward in the manner described above. Following the completion of sweep component changes, the system returns to step 314 in which a determination is made as to whether the new oscillator range code is equal to the existing oscillator range code. It should be noted that following the incrementing of oscillator range code at step 316, step 314 compares the new oscillator range code found in step 320 to the incremented oscillator range code. In other words, at this point the system has incremented frequency once and a determination is now made at step 314 as to whether one increment is sufficient. In the event the incremented oscillator range code does not equal the new oscillator range code, the system moves to step 315 in which a determination is made as to whether frequency is to be increased. If frequency increase is required, the system again moves through step 316 incrementing the oscillator range code and changing frequency afterwhich at a step 317 the sweep components are again readjusted. This process continues until a determination is made at step 314 that the new oscillator range code and the incremented oscillator range code are equal indicating the desired oscillator range code has been reached. At this point, the system moves to a step 321 in which an indication of no further frequency change is given and the system returns to start 301.

If, however, a determination is made at step 315 that frequency is not to increase (which indicates frequency is to decrease) the system moves to a step 318 in which the oscillator range code is decremented afterwhich the external sweep components are correspondingly adjusted in anticipation of the oscillator frequency change. Thereafter, the system moves to a step 319 in which the oscillator frequency is changed in accordance with the decrement of oscillator range code at step 318. Thereafter, the system returns to step 314 to determine whether the decremented oscillator range code equals the new oscillator range code. If it does, the system returns to step 321 and an indication of no change is given afterwhich the system returns to start 301. If, however, a determination is made at step 314 that a further oscillator range code change is required, the system returns to decision step 315 in which a determination is made as to whether frequency will increase. In the event frequency is to decrease, the system moves to step 318 in which oscillator range code is again decremented and the sweep components are again adjusted in anticipation of frequency decrease. Thereafter, the system moves to step 319 in which the oscillator frequency is changed afterwhich the system returns to step 314. Thus, the cycle continues until a determination is made at step 314 that the decremented oscillator range code is equal to the new oscillator range code indicating no further change is necessary. At this point, the system moves to step 321 in which an indication is given of no further frequency change following which the system returns to start 301.

Thus, in the foregoing described portion of the operation of the present invention system in response to a standard or broadcast signal, the system moves directly to the look-up table to determine the new oscillator range code desired and thereafter compares the new oscillator range code to the presently existing oscillator range code and in response to this comparison alternatively increments the oscillator range code and changes oscillator frequency prior to adjusting the sweep components if frequency is to increase or, alternatively, decrements oscillator range code and adjusts the external sweep components prior to changing oscillator frequency. In either case, the system cycles through incremental changes of frequency and corresponding adjustment of the external sweep components. In this manner, damage to the sweep system which would otherwise be possible due to dramatic or abrupt frequency changes and mistuning of the system in the face of these changes is avoided.

Returning to step 302 in which a determination is made as to whether the video-type is standard or nonstandard, in the event a nonstandard video-type is applied to the present invention system, the system moves to a step 303 in which the above-described pulse counting operation previously referred to as first frequency approximation is carried forward to produce a pulse count of clock signals occurring between the horizontal synchronization signals. This number referred to a "pulse count" is read and temporarily stored at step 303. Thereafter, the system moves to a step 304 in which a determination is made as to whether horizontal sync is present. If no horizontal sync is present, the system moves to step 321 in which an indication of no frequency change is given following which the system returns to step 301. If, however, a determination is made at step 304 that horizontal synchronizing signals are present, the system moves to a decision step 305 in which a determination is made as to whether the pulse count is outside the frequency window for the present oscillator range codes. If the pulse count is within the frequency window, the system returns to start 301 via a step 321 in which an indication of no change is given. If, however, the pulse count is found at step 305 to be outside the frequency window for the present oscillator range code, the system moves to a step 306 in which a determination is made as to whether the pulse count is above the frequency window. If the pulse count is above the frequency window, the system moves to a step 307 in which a determination is made as to whether a zero oscillator range code exists. In the presence of a zero oscillator range code, the system returns to step 303. If, however, a nonzero oscillator range code exists, the system moves to a step 308 in which the address of the look-up table (LUT) is decremented by one and the system returns to step 306. Once again a determination is made as to whether the pulse count is greater than the new END number in column 178 of LUT 175. This process continues through steps 306, 307 and 308 until a determination is made that the pulse count is not above the END number in column 178 of LUT 175.

In the event a determination is made at step 306 that the pulse count is not above the END number, the system moves to a step 309 in which a determination is made as to whether the pulse count is below the START number in column 177 of LUT 175. If the pulse count is found below the START number, the system moves to a step 310 in which a determination is made as to whether the oscillator range code is at fifteen which corresponds to the highest range code. If the oscillator range code equals fifteen the system returns to step 303. If the oscillator range code is not equal to fifteen, the system moves to a step 311 in which the address of look-up table 175 is incremented by one afterwhich the system returns to step 306. Thus, the system moves through steps 306, 309, 310 and 311 until the pulse count is neither higher than END number 178 nor lower than START number 177.

Once it has been determined at steps 306 and 309 that the pulse count is neither above nor below the START and END numbers, the system has determined that the pulse count is within the frequency window of the newly acquired LUT address. After this, the pulse count is latched into storage at a step 312. The system then moves to a step 313 in which the new LUT address is latched as the new oscillator range code. Thereafter, the system moves to step 314 and the above-described process of sequential incrementing or decrementing of oscillator range code frequency and sweep component adjustment is carried forward until the oscillator range code is equal to the new oscillator range code. Thereafter, the system returns to start 301 via step 321 in which an indication of no change is given.

Thus, once a determination is made that a nonstandard video-type signal is applied to the system, the above-described LUT search process (where the pulse count number from latch 220 is compared with START and END numbers of a corresponding LUT address) is performed. Once the pulse count number is within the START and END numbers, the LUT address is latched as the new ORC and is available to carry forward the incremental or decremental changes of oscillator range code, oscillator frequency and sweep component adjustment by which the present invention system transitions from one signal frequency to another.

It should be apparent to those skilled in the art that the present invention system provides an orderly sequential and safe system for accommodating the broad frequency changes which an adaptive horizontal scan system of the type shown may encounter. The system protects sweep components from damage which would otherwise be caused in the event abrupt frequency changes or improperly phased frequency changes and sweep component adjustments were attempted.

It will apparent to those skilled in the art that while the present invention system is shown utilizing adjustment and tuning of the phase locked loop low pass filter, drive signal to the horizontal output amplifier, and horizontal yoke tuning, other sweep component systems may be similarly adjusted and may receive the benefit of proper timing and phasing within the present invention system without departing from the spirit and scope of the present invention. For example, it may be desirable in certain systems to alter the tuning of the high voltage generation system in a similar fashion to that shown in the preferred embodiment. In addition, other collateral systems may utilize the present invention to properly integrate and phase other systems without departing from the spirit and scope of the present invention.

The present invention system is able to permit the adaptive horizontal scan system to accommodate virtually any standard broadcast system as well as a great variety of auxiliary or monitor type signal sources such as personal computers or the like and accommodate a broad spectrum of scan frequencies without sacrificing the frequency and phase stability of the system or damaging sweep system components.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. An adaptive scan system for producing display scan signals related to a periodic reference signal, said adaptive scan system comprising:
   scan synchronizing means for synchronizing said scan system to said reference signal;
   scan system change means for altering said adaptive scan system to accommodate a selected one of a plurality of scan frequencies; and
   change sequence means for controlling the relative order in which said scan synchronizing means and said scan system change means operate.

2. An adaptive scan system as set forth in claim 1 wherein said change sequence means include:
   means for receiving a desired scan frequency;
   comparing means for comparing said desired scan frequency to the existing scan frequency; and phasing means for establishing the order of operation for said scan system change means and said scan synchronizing means in a first sequence for increasing desired scan frequencies and a second sequence for decreasing desired scan frequencies.

3. An adaptive scan system as set forth in claim 2 wherein said adaptive scan system includes a plurality of frequency tuned elements and wherein said scan system change means adjusts the frequency tuning of said tuned elements.

4. An adaptive scan system as set forth in claim 3 wherein said scan synchronizing means include increment decrement means for initiating frequency incremental changes or frequency decremental changes to approach synchronization with said reference signal and wherein said scan system change means are operative during each frequency incremental or frequency decremental change to correspondingly adjust the frequency tuning of said tuned elements.

5. An adaptive scan system as set forth in claim 4 wherein said first sequence of said phasing means includes changing scan system frequency before adjusting the frequency tuning of said tuned elements and said second sequence of said phasing means includes adjusting the frequency tuning of said tuned elements before changing scan system frequency.

6. For use in a horizontal scan system for horizontally scanning a cathode ray tube display and having oscillator means for producing periodic scan signals, a tuned scanning yoke, an output amplifier driven by said oscillator means and defining a periodic conduction interval for energizing said tuned yoke and a phase locked loop having a filter therein for receiving a periodic reference synchronizing signal and controlling the frequency of said oscillator means in response thereto, adaptive scan sychronizing means comprising:
   first approximation synchronizing means for changing the frequency of said oscillator means to a first approximation of a desired frequency;
   scan system adjusting means for controlling the tuning of said scanning yoke, the duration of said conduction interval, and the filter characteristic of said filter; and
   sequence means for coordinating the actions of said first approximation synchronizing means and said scan system adjusting means in response to a frequency change of the applied reference synchronizing signal to avoid damage to said horizontal scan system.

7. An adaptive scan sychronizing means as set forth in claim 6 wherein the reference signal defines a frequency within a spectrum of reference signal frequencies and wherein said first approximation synchronizing means includes:
   frequency adjusting means for cyclically comparing the frequency of said oscillator means to that of said selected one of said reference signals and incrementing or decrementing the frequency of said oscillator means toward the frequency of said selected one said reference signals until the frequency of said oscillator means is within a predetermined frequency window including the frequency of said reference signals.

8. An adaptive scan synchronizing means as set forth in claim 7 whererin said frequency adjusting means includes a look-up table memory having stored therein a plurality of reference signal frequency ranges within said frequency spectrum defining said frequency windows and a corresponding plurality of address row numbers associated therewith and wherein said frequency adjusting means initially approximates said oscillator frequency in accordance with said address row numbers.

9. An adaptive scan synchronizing means as set forth in claim 7 wherein said sequence means includes direction means for indicating the direction of frequency change for each cycle of said frequency adjusting means and operating said scan system adjusting means relative to said frequency adjusting means within each cycle as a function of frequency change direction.

10. An adaptive scan synchronizing means as set forth in claim 9 wherein said scan system adjusting means is operated before each frequency decrement and after each frequency increment within said cycle.

11. For use in synchronizing a scan oscillator within a scan system, having a plurality of frequency dependent elements, to a selected periodic reference signal within a spectrum of reference signal frequencies, the method comprising the steps of:
   receiving a selected periodic reference signal;
   comparing the frequency of said selected reference signal to the existing oscillator frequency;
   determining the need for substantial oscillator frequency change to synchronize said oscillator to said selected reference signal;
   finding the direction of oscillator frequency change needed; and
   adjusting said frequency dependent elements and said oscillator frequency in a sequence responsive to the oscillator frequency change direction.

12. The method set forth in claim 11 wherein said determining step includes the steps of:
  establishing a plurality of frequency ranges within the spectrum of reference signal frequencies; and
  examining the results of said comparison step and determining a need for substantial oscillator frequency change in the event the existing scan oscillator frequency and selected reference ssignal frequency are found in different frequency ranges.

13. The method set forth in claim 12 wherein said adjusting step includes the steps of:
  changing scan oscillator frequency toward the frequency of said selected reference signal by a discrete frequency change;
  altering the frequency characteristic of said frequency dependent elements after said changing step for frequency increases and before said changing step for frequency decreases; and
  returning to said comparing step.

* * * * *